(12) United States Patent
Park et al.

(10) Patent No.: US 9,620,696 B2
(45) Date of Patent: Apr. 11, 2017

(54) THERMOELECTRIC CONVERSION MATERIAL AND PRODUCING METHOD THEREOF, AND THERMOELECTRIC CONVERSION ELEMENT USING THE SAME

(71) Applicant: LG CHEM, LTD., Seoul (KR)

(72) Inventors: Cheol-Hee Park, Daejeon (KR);
Se-Hui Sohn, Daejeon (KR);
Seung-Tae Hong, Daejeon (KR);
Won-Jong Kwon, Daejeon (KR);
Tae-Hoon Kim, Seoul (KR)

(73) Assignee: LG CHEM, LTD., Seoul (KR)

( * ) Notice: Subject to any disclaimer, the term of this patent is extended or adjusted under 35 U.S.C. 154(b) by 141 days.

(21) Appl. No.: 14/175,513

(22) Filed: Feb. 7, 2014

(65) Prior Publication Data

US 2014/0190544 A1 Jul. 10, 2014

Related U.S. Application Data

(60) Division of application No. 13/531,186, filed on Jun. 22, 2012, now Pat. No. 8,715,538, which is a
(Continued)

(30) Foreign Application Priority Data

Aug. 28, 2008 (KR) .................. 10-2008-0085240
Oct. 6, 2008 (KR) .................. 10-2008-0097779
Nov. 11, 2008 (KR) .................. 10-2008-0111557

(51) Int. Cl.
*H01B 1/08* (2006.01)
*H01B 1/10* (2006.01)
(Continued)

(52) U.S. Cl.
CPC ............ *H01L 35/16* (2013.01); *C09K 11/881* (2013.01); *C09K 11/885* (2013.01); *H01B 1/08* (2013.01);
(Continued)

(58) Field of Classification Search
CPC .... H01B 1/00; H01B 1/08; H01B 1/10; H01L 35/12; H01L 35/16
See application file for complete search history.

(56) References Cited

U.S. PATENT DOCUMENTS 4,366,336 A  12/1982 Donaghey
5,418,007 A   5/1995 Debe
(Continued)

FOREIGN PATENT DOCUMENTS

CN  1478308 A   2/2004
JP  11-031849   2/1999
(Continued)

OTHER PUBLICATIONS

Hiramatsu et al "Crystal Structures, Optoelectronic Properties, and Electronic Structures of Layered Oxychalcogenides MCu OCh . . . ", Chem. Mater. 2008, 20, 326-334 (pub Dec. 11, 2007).*
(Continued)

*Primary Examiner* — Mark Kopec
(74) *Attorney, Agent, or Firm* — Dentons US LLP (57) ABSTRACT

Compound semiconductors, expressed by the following formula: $Bi_{1-x}M_xCu_wO_{a-y}Q1_yTe_{b-z}Q2_z$. Here, M is at least one element selected from the group consisting of Ba, Sr, Ca, Mg, Cs, K, Na, Cd, Hg, Sn, Pb, Eu, Sm, Mn, Ga, In, Tl, As and Sb; Q1 and Q2 are at least one element selected from the group consisting of S, Se, As and Sb; x, y, z, w, a, and b are $0 \leq x < 1$, $0 < w \leq 1$, $0.2 < a < 4$, $0 \leq y < 4$, $0.2 < b < 4$ and $0 \leq z < 4$. These compound semiconductors may be used for various applications such as solar cells or thermoelectric conversion
(Continued)

elements, where they may replace compound semiconductors in common use, or be used along with compound semiconductors in common use.

9 Claims, 13 Drawing Sheets

Related U.S. Application Data continuation of application No. 12/906,917, filed on Oct. 18, 2010, now Pat. No. 8,226,843, which is a continuation of application No. PCT/KR2008/007041, filed on Nov. 28, 2008.

(51) Int. Cl.

| | |
|---|---|
| *H01L 35/12* | (2006.01) |
| *H01L 35/16* | (2006.01) |
| *C09K 11/88* | (2006.01) |
| *H01L 31/032* | (2006.01) |
| *H01L 31/072* | (2012.01) |
| *H01L 31/0725* | (2012.01) |
| *H01L 35/22* | (2006.01) |
| *H01L 31/0272* | (2006.01) |
| *H01L 35/18* | (2006.01) |

(52) U.S. Cl.
CPC ........... *H01B 1/10* (2013.01); *H01L 31/0272* (2013.01); *H01L 31/032* (2013.01); *H01L 31/072* (2013.01); *H01L 31/0725* (2013.01); *H01L 35/18* (2013.01); *H01L 35/22* (2013.01); *Y02E 10/50* (2013.01)

(56) References Cited

U.S. PATENT DOCUMENTS

| | | | |
|---|---|---|---|
| 5,431,021 A | 7/1995 | Gwilliam et al. | |
| 5,487,952 A | 1/1996 | Yoo et al. | |
| 5,726,381 A | 3/1998 | Horio et al. | |
| 6,091,014 A | 7/2000 | Eklund et al. | |
| 6,251,701 B1 | 6/2001 | McCandless | |
| 6,384,312 B1 | 5/2002 | Ghoshal et al. | |
| 6,444,894 B1 | 9/2002 | Sterzel | |
| 6,660,925 B1 | 12/2003 | Sharp | |
| 6,743,973 B2 | 6/2004 | Hayashi et al. | |
| 6,942,728 B2 | 9/2005 | Caillat et al. | |
| 7,091,136 B2 | 8/2006 | Basol | |
| 7,649,139 B2 | 1/2010 | Mihara et al. | |
| 2003/0110892 A1 | 6/2003 | Nicoloau | |
| 2005/0139249 A1 | 6/2005 | Ueki et al. | |
| 2011/0017935 A1 | 1/2011 | Park et al. | |
| 2012/0211045 A1* | 8/2012 | Park | C09K 11/881 136/238 |
| 2014/0000671 A1* | 1/2014 | Park | C09K 11/881 136/238 |

FOREIGN PATENT DOCUMENTS

| | | |
|---|---|---|
| JP | 11-186616 | 7/1999 |
| JP | 2001-223392 | 8/2001 |
| JP | 2002-232026 | 8/2002 |
| JP | 2004-288841 | 10/2004 |
| JP | 2007-258200 | 10/2007 |
| JP | 2008-085309 | 4/2008 |

OTHER PUBLICATIONS

Ohtani et al "Electrical properties of layered copper oxyselenides . . . ", Journal of Alloys and Compounds 262-263 (1997) 175-179.*

B.A. Popovkin et al., "New Layered Phases of the MOCuX (M=Ln, Bi; X = S, Se, Te) Family: A Geometric Approach to the Explanation of Phase Stability", Russian Journal of Inorganic Chemistry, vol. 43, No. 10, 1998, pp. 1471-1475.

Kouichi Takase et al., "Charge Density Distribution of Transparent p-type Semiconductor (LaO) CuS", Applied Physics Letters 90, (2007) pp. 161916 (1-3).

Evans et al "Synthesis and characterization of the new oxyselenide B12YO4Cu2Se2", Chem. Commun., 2002, 912-913.

Ohtani et al "Electrical Properties of layered copper oxyselenides (BiO)Cu1-xSe and (Bi1-xSrx)OCuSe", Journal of Alloys and Compounds 262-263 (1997) 175-179.

* cited by examiner

THERMOELECTRIC CONVERSION MATERIAL AND PRODUCING METHOD THEREOF, AND THERMOELECTRIC CONVERSION ELEMENT USING THE SAME

This application is a divisional application of U.S. Ser. No. 13/531,186, filed Jun. 22, 2012, now U.S. Pat. No. 8,715,538, which is a continuation of U.S. Ser. No. 12/906,917, filed on Oct. 18, 2010, now U.S. Pat. No. 8,226,843, issued on Jul. 24, 2012, which is a continuation of International Application No. PCT/KR2008/007041, filed Nov. 28, 2008, which claims priority to Korean Patent Applications Nos. 10-2008-0085240, 10-2008-0097779 and 10-2008-0111557 filed in Republic of Korea on Aug. 29, 2008, Oct. 6, 2008 and Nov. 11, 2008, respectively, the entire contents of which are incorporated herein by reference.

TECHNICAL FIELD

The present invention provides new compound semiconductors, their method of preparation, solar cells and thermoelectric conversion elements by using the same.

BACKGROUND OF THE INVENTION

A compound semiconductor is a compound that is not a single element like germanium but is obtained by combining at least two kinds of elements, and thus operated as a semiconductor. Various kinds of compound semiconductors have been developed and used in many fields. Representatively, compound semiconductors are used for light emitting devices such as LED or laser diode using photoelectric conversion effects, solar cells, and thermoelectric conversion elements using Peltier effects.

Among them, an environment-friendly solar cell not requiring any other energy source except solar light is intensively studied as an alternative energy source in the future. The solar cell is generally classified into a silicon solar cell using a single element of silicon mainly, a compound semiconductors solar cell using a compound semiconductor, and a tandem solar cell having at least two laminated solar cells with different bandgap energies.

The compound semiconductor solar cell uses a compound semiconductor in a light absorption layer that absorbs solar ray to generate an electron-hole pair. The compound semiconductor includes III-V compound semiconductors such as GaAs, InP, GaAlAs and GaInAs, II-VI compound semiconductors such as CdS, CdTe and ZnS, and I-III-VI compound semiconductors represented by $CuInSe_2$.

The light absorption layer of the solar cell needs excellent long-term electric optical stability, high photoelectric conversion efficiency, and easy control of bandgap energy or conductivity by doping or change of composition. Also, for practical use, the light absorption layer should meet requirements in production costs and yield. Various compound semiconductors explained above do not satisfy all of these conditions, so they are suitably selected and used depending on their advantages and disadvantages.

In addition, the thermoelectric conversion element is applied to thermoelectric conversion power generation or thermoelectric conversion cooling. For example, for the thermoelectric conversion power generation, a temperature difference is applied to the thermoelectric conversion element to generate thermoelectromotive force, and then the thermoelectromotive force is used to convert thermal energy into electric energy.

Energy conversion efficiency of the thermoelectric conversion element depends on ZT value that is a performance index of thermoelectric conversion material. ZT value is determined by Seebeck coefficient, electric conductivity and thermal conductivity. In more detail, ZT value is in proportion to electric conductivity and square of Seebeck coefficient and in reverse proportion to thermal conductivity. Thus, in order to enhance the energy conversion efficiency of a thermoelectric conversion element, it is required to develop thermoelectric conversion materials with high Seebeck coefficient, high electric conductivity or low thermal conductivity.

DISCLOSURE

Technical Problem

An object of the present invention is to provide new compound semiconductors that may be useful for various applications such as solar cells and thermoelectric conversion material of thermoelectric conversion elements.

Another object of the present invention is to provide a method for producing the above new compound semiconductors.

Furthermore, another object of the present invention is to provide a solar cell or a thermoelectric conversion element using the new compound semiconductors material.

Technical Solution

As a result of the search for new compound semiconductors, compositions of the formula 1 are proposed in the present invention. It was found that these new compounds may be used as light absorption layers of solar cells, thermoelectric conversion materials of thermoelectric conversion elements, and so on.

$$Bi_{1-x}M_xCu_wO_{a-y}Q1_yTe_{b-z}Q2_z \qquad \text{Formula 1}$$

where M is at least one element selected from the group consisting of Ba, Sr, Ca, Mg, Cs, K, Na, Cd, Hg, Sn, Pb, Eu, Sm, Mn, Ga, In, Tl, As and Sb; Q1 and Q2 are at least one element selected from the group consisting of S, Se, As and Sb with $0 \leq x < 1$, $0 < w \leq 1$, $0.2 < a < 4$, $0 \leq y < 4$, $0.2 < b < 4$ and $0 \leq z < 4$.

According to the present invention, the compound semiconductors expressed by the formula 1 preferably have the compositions of $BiCu_{0.8-1.2}O_{0.8-1.2}Te_{0.8-1.2}$.

According to the present invention, x, y and z of the formula 1 are x+y+z>0, and a, y, b and z are preferably a=1, $0 \leq y < 1$, b=1 and $0 \leq z < 1$, respectively.

In other case, x, w, a, y, b and z are preferably $0 \leq x < 0.15$, $0.8 \leq w \leq 1$, a=1, $0 \leq y < 0.2$, b=1 and $0 \leq z < 0.5$, respectively. Here, M is preferably any one selected from the group consisting of Sr, Cd, Pb and Tl, and Q1 and Q2 are preferably Se or Sb, respectively.

In another aspect of the present invention, it provides methods for producing compound semiconductors expressed by the above formula 1 by heating mixtures of $Bi_2O_3$, Bi, Cu and Te.

Alternatively, the present invention provides methods for producing compound semiconductors expressed by the formula 1 by heating mixtures of $Bi_2O_3$, Bi, Cu, Te, and at least one selected from the group consisting of elemental Ba, Sr, Ca, Mg, Cs, K, Na, Cd, Hg, Sn, Pb, Eu, Sm, Mn, Ga, In, Tl, As and Sb, or their oxides.

Also alternatively, the present invention provides methods for producing compound semiconductors expressed by the formula 1 by heating mixtures of $Bi_2O_3$, Bi, Cu, Te, at least one selected from the group consisting of elemental S, Se, As, and Sb, or their oxides, and at least one selected from the group consisting of elemental Ba, Sr, Ca, Mg, Cs, K, Na, Cd, Hg, Sn, Pb, Eu, Sm, Mn, Ga, In, Tl, As, and Sb, or their oxides.

In the method according to the present invention, the sintering process is preferably executed at temperatures of 400 to 570° C.

Advantageous Effects

The new compound semiconductors of the present invention may replace compound semiconductors in common use, or be used along with compound semiconductors in common use. In particular, the compound semiconductors may be useful for thermoelectric conversion elements due to their excellent thermoelectric conversion performance, and for light-absorption-layer applications for solar cells. Furthermore, the compound semiconductors of the present invention are expected as being used for IR window or IR sensor that selectively passes IR.

DESCRIPTION OF DRAWINGS

Other objects and aspects of the present invention will become apparent from the following description of embodiments with reference to the accompanying drawing in which.

BEST MODE

Compositions of the compound semiconductors of the present invention are expressed by the following formula 1.

$$Bi_{1-x}M_xCu_wO_{a-y}Q1_yTe_{b-z}Q2_z \qquad \text{Formula 1}$$

In the formula 1, M is at least one element selected from the group consisting of Ba, Sr, Ca, Mg, Cs, K, Na, Cd, Hg, Sn, Pb, Eu, Sm, Mn, Ga, In, Tl, As and Sb, and Q1 and Q2 are at least one element selected from the group consisting of S, Se, As and Sb with $0 \leq x<1$, $0<w \leq 1$, $0.2<a<4$, $0 \leq y<4$, $0.2<b<4$ and $0 \leq z<4$.

In the formula 1, x, y, and z are preferably $0 \leq x \leq \frac{1}{2}$, $0 \leq y \leq a/2$ and $0 \leq z \leq b/2$, respectively.

In the formula 1, x, y, and z may be respectively x=0, y=0 and z=0. Compositions of the formula 1 are preferably $BiCu_{0.8-1.2}O_{0.8-1.2}Te_{0.8-1.2}$, and BiCuOTe is particularly preferred.

In the formula 1, x, y, and z are x+y+z>0, and a, y, b and z of the formula 1 are preferably a=1, $0 \leq y<1$, b=1 and $0 \leq z<1$, respectively. In other cases, x, w, a, y, b and z may be respectively $0 \leq x<0.15$, $0.8 \leq w \leq 1$, a=1, $0 \leq y<0.2$, b=1 and $0 \leq z<0.5$. Here, M is preferably any one selected from the group consisting of Sr, Cd, Pb and Tl, and Q1 and Q2 are preferably Se or Sb, respectively. More preferably, x, w, a, y, b and z of the formula 1 are respectively $0 \leq x<0.15$, $0.8 \leq w \leq 1$, a=1, $0 \leq y<0.2$, b=1 and $0 \leq z<0.5$, M is any one selected from the group consisting of Sr, Cd, Pb and Tl, and Q1 and Q2 are respectively Se or Sb.

For the compositions of the formula 1, it is more preferred that x, w, a, y, b and z of the formula 1 are respectively $0<x<0.15$, w=1, a=1, y=0, b=1 and z=0, and M is any one selected from the group consisting of Sr, Cd, Pb and Tl. In addition, in the formula 1 where x, w, y and z of the formula 1 are respectively x=0, w=1, a=1, y=0, b=1 and $0<z \leq 0.5$, and Q2 is Se or Sb, it is more preferred that x, w, a, y, b and z of the formula 1 are respectively $0<x<0.15$, w=1, a=1, y=0, b=1 and z=0, and M is any one selected from the group consisting of Sr, Cd, Pb and Tl.

Meanwhile, the compound semiconductors expressed by the formula 1 may be produced by mixing powders of $Bi_2O_3$, Bi, Cu and Te and then vacuum-sintering the mixture, but the present invention is not limited thereto.

Also, the compound semiconductors expressed by the formula 1 may be produced by heating mixtures of $Bi_2O_3$, Bi, Cu, Te, and at least one selected from the group consisting of Ba, Sr, Ca, Mg, Cs, K, Na, Cd, Hg, Sn, Pb, Eu, Sm, Mn, Ga, In, Tl, As and Sb, or their oxides in an evacuated silica tube, however the present invention is not limited thereto.

In addition, the compound semiconductors expressed by the formula 1 may be produced by heating mixtures of $Bi_2O_3$, Bi, Cu, Te, at least one element selected from the group consisting of S, Se, As and Sb, or their oxides, and at least one selected from the group consisting of Ba, Sr, Ca, Mg, Cs, K, Na, Cd, Hg, Sn, Pb, Eu, Sm, Mn, Ga, In, Tl, As, and Sb, or their oxides in an evacuated silica tube, however the present invention is not limited thereto.

The compound semiconductors of the present invention may be produced by sintering mixtures in a flowing gas such as Ar, He or $N_2$, which partially includes hydrogen or does not include hydrogen. The sintering process is preferably executed at a temperature of 400 to 750° C., more preferably 400 to 570° C.

Subsequently, a solar cell using the compound semiconductors of the present invention as a light absorption layer is explained. The solar cell using the compound semiconductors according to the present invention may be manufactured in a structure where a front transparent electrode, a buffer layer, a light absorption layer, a rear electrode, and a substrate are subsequently stacked. This structure is now explained in brief.

The substrate located at a lowermost position is generally made of glass, and the rear electrode formed on the entire surface of the substrate is formed by depositing metal such as Mo. Subsequently, the compound semiconductor of the present invention is laminated on the rear electrode by means of electron beam deposition, sol-gel method, PLD (Pulsed Laser Deposition) or the like. The buffer layer for buffering a difference of bandgaps and lattice constants between the light absorption layer and a ZnO layer commonly used as the front transparent electrode is formed on the light absorption layer. The buffer layer may be formed by depositing material such as CdS by means of CBD (Chemical Bath Deposition) or the like. Subsequently, the front transparent electrode is formed on the buffer layer by sputtering a ZnO lamination film or a ZnO and ITO lamination film. The compound semiconductors of the present invention acting as a light absorption layer is basically a p-type semiconductors, so ZnO of the front transparent electrode that is a n-type semiconductors plays a role as a front electrode and makes a p-n junction with the light absorption layer.

Meanwhile, the above solar cell may be modified in various ways. For example, the compound semiconductor of the present invention may be used as a light absorption layer in a tandem solar cell. In the tandem solar cell, solar cells made of materials with different bandgap energies may be laminated, and the solar cell to be laminated may use silicon or other compound semiconductors well known in the art. Furthermore, the bandgap of the compound semiconductor of the present invention may be changed such that a plurality of solar cells using compound semiconductors with different bandgaps as a light absorption layer are laminated. The bandgap of the compound semiconductors according to the present invention may be easily controlled by changing components of the compound, particularly replacing composition ratios of components in the compounds, particularly Te.

Compound of BiCuOSe which includes Se instead of Te is known [A. M. Kusainova, P. S. Berdonosov, L. N. Kholodkovskaya, L. G. Akselrud, V. A. Dolgikh, and B. A. Popovkin, "Powder X-Ray and IR Studies of the New Oxyselenides MOCuSe(M=Bi, Gd, Dy)", J. Solid State Chemistry, 118, 74-77 (1995)]. Also, compounds of LnCuOTe (Ln=La, Ce, Nd) which includes La, Ce or Nd in place of Bi [M. L. Liu, L. B. Wu, F. Q. Huang, L. D. Chen, J. A. Ibers, "Syntheses, Crystal and Electronic Structure, and Some Optical and Transport Properties of LnCuOTe(Ln=La, Ce, Nd)", J. Solid State Chemistry, 180, 62-69 (2007)] have been reported.

However, these compounds are different from the compound semiconductors of the present invention in the points of compositions.

Meanwhile, the compound semiconductors of the present invention exhibit a great ZT value that is a performance index of thermoelectric conversion material. Namely, the compound semiconductors of the present invention exhibit good thermoelectric conversion performance. Thus, the compound semiconductors of the present invention may replace compound semiconductors in common use, or be used along with compound semiconductors in common use for thermoelectric conversion elements.

Furthermore, it is expected that the compound semiconductors of the present invention may be applied to an IR window or sensor that selectively transmits IR.

MODE FOR INVENTION

Hereinafter, the preferred embodiment of the present invention will be described in detail based on examples. However, the embodiments of the present invention may be modified in various ways, and the scope of the present invention should not be interpreted as being limited to the examples. The embodiments of the present invention are provided just for explaining the present invention more perfectly to those having ordinary skill in the art.

Example 1

BiCuOTe

In order to prepare BiCuOTe, 1.1198 g of $Bi_2O_3$ (Aldrich, 99.9%, 100 mesh), 0.5022 g of Bi (Aldrich, 99.99%, <10 m), 0.4581 g of Cu (Aldrich, 99.7%, 3 m), and 0.9199 g of Te (Aldrich, 99.99%, ~100 mesh) were well mixed by using agate mortar, and then heated in an evacuated silica tube at 510° C. for 15 hours, thereby obtaining BiCuOTe powder.

The powder X-ray diffraction (XRD) data were collected at room temperature on a Bragg-Brentano diffractometer (Bruker Advance D8 XRD) with a Cu X-ray tube ($\lambda$=1.5406 Å, 50 kV, 40 mA). The step size was 0.02 degree.

TOPAS program (R. W. Cheary, A. Coelho, J. Appl. Crystallogr. 25 (1992) 109-121; Bruker AXS, TOPAS 3, Karlsruhe, Germany (2000)) was used in order to determine the crystal structure of the obtained material. The analysis results are shown in Table 1 and FIG. 2.

TABLE 1

| Atom | site | x | y | z | Occup. | Beq |
|---|---|---|---|---|---|---|
| Bi | 2c | 0.25 | 0.25 | 0.37257(5) | 1 | 0.56(1) |
| Cu | 2a | 0.75 | 0.25 | 0 | 1 | 0.98(3) |
| O | 2b | 0.75 | 0.25 | 0.5 | 1 | 0.26(12) |
| Te | 2c | 0.25 | 0.25 | 0.81945(7) | 1 | 0.35(1) |

Crystallographic data obtained from Rietveld refinement of BiCuOTe [Space group I4/nmm (No. 129), a=4.04138(6) Å, c=9.5257(2) Å]

Figure 1:
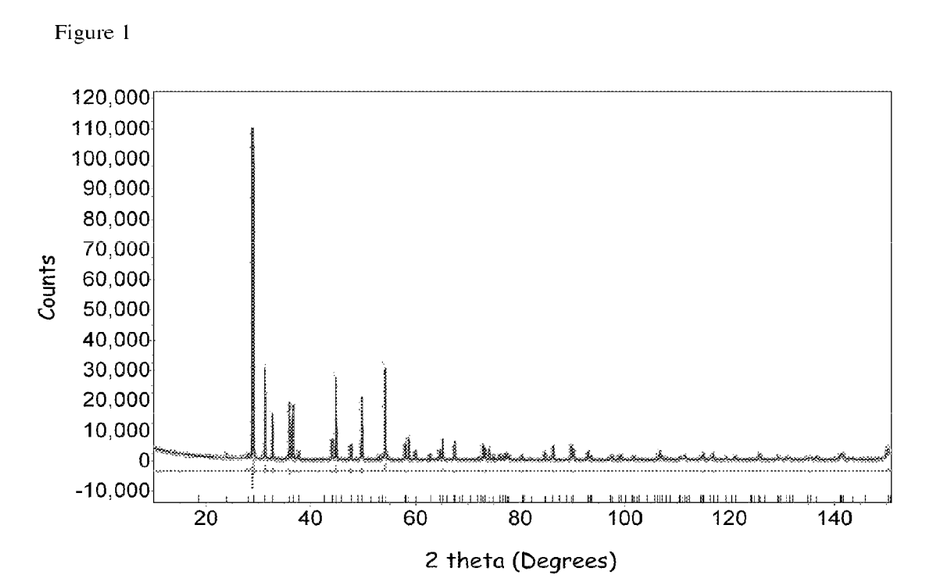
FIG. 1 shows Rietveld refinement profiles for BiCuOTe, comparing X-ray diffraction pattern with a calculated pattern from a structural model.

FIG. 1 shows a Rietveld refinement profile that compares observed X-ray diffraction pattern of BiCuOTe with a calculated X-ray diffraction pattern from a structural model. FIG. 1 shows that the measured pattern well agrees with the calculated pattern according to Table 1, which implies that the material obtained in this example is BiCuOTe.

Figure 2:
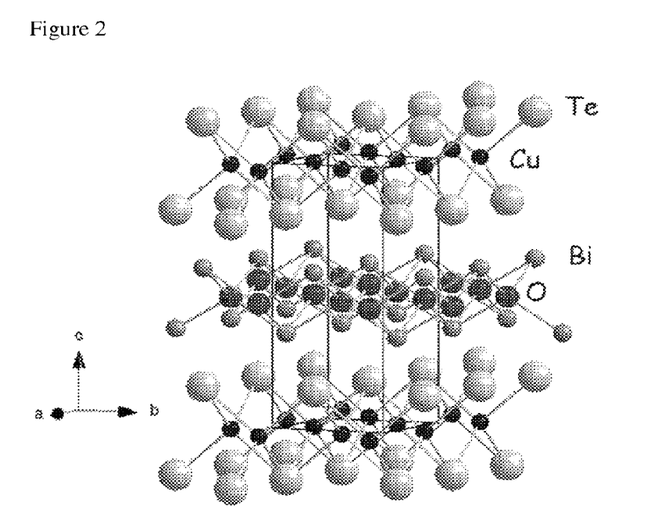
FIG. 2 shows the crystal structure of BiCuOTe.

As shown in FIG. 2, the BiCuOTe compound semiconductors exhibits a natural super-lattice structure in which $Cu_2Te_2$ layers and $Bi_2O_2$ layers are repeated along a c-crystalline axis.

Example 2

$BiCu_{0.9}OTe$

In order to prepare $BiCu_{0.9}OTe$, 1.1371 g of $Bi_2O_3$ (Aldrich, 99.9%, 100 mesh), 0.51 g of Bi (Aldrich, 99.99%, <10 m), 0.4187 g of Cu (Aldrich, 99.7%, 3 m), and 0.9342 g of Te (Aldrich, 99.99%, ~100 mesh) were well mixed by using agate mortar, and then heated in an evacuated silica tube at 510° C. for 15 hours, thereby obtaining $BiCu_{0.9}TeO$ powder.

Figure 3:
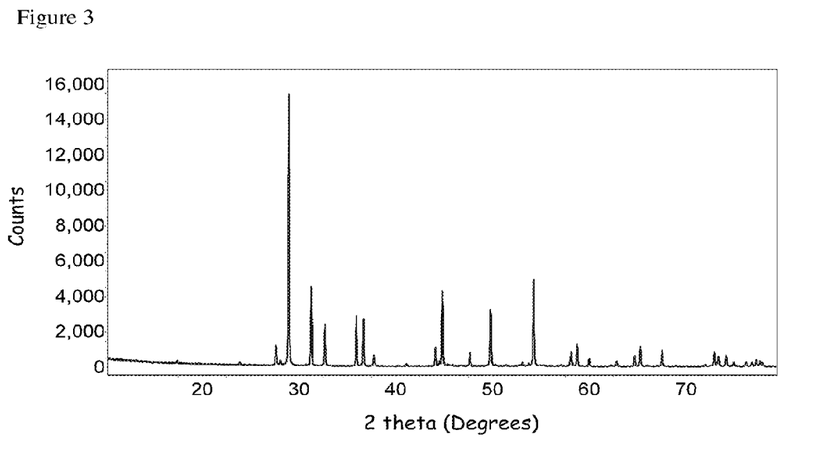
FIG. 3 shows X-ray diffraction pattern of $BiCu_{0.9}OTe$.

X-ray diffraction analysis was conducted for the sample in the same way as the example 1. As shown in FIG. 3, the material obtained in the example 2 was identified as $BiCu_{0.9}TeO$.

Example 3

$Bi_{0.98}Pb_{0.02}CuOTe$

In order to prepare $Bi_{0.98}Pb_{0.02}CuOTe$, 2.5356 g of $Bi_2O_3$ (Aldrich, 99.9%, 100 mesh), 1.1724 g of Bi (Aldrich, 99.99%, <10 m), 1.0695 g of Cu (Aldrich, 99.7%, 3 m), 0.0751 g of PbO (Canto, 99.5%), and 2.1475 g of Te (Aldrich, 99.99%, ~100 mesh) were well mixed by using agate mortar, and then heated in an evacuated silica tube at 510° C. for 15 hours, thereby obtaining $Bi_{0.98}Pb_{0.02}CuOTe$ powder.

The powder X-ray diffraction (XRD) data were collected at room temperature on a Bragg-Brentano diffractometer (Broker D4-Endeavor XRD) with a Cu X-ray tube (λ=1.5406 Å, 50 kV, 40 mA). The step size was 0.02 degree.

TOPAS program (R. W. Cheary, A. Coelho, J. Appl. Crystallogr. 25 (1992) 109-121; Bruker AXS, TOPAS 3, Karlsruhe, Germany (2000)) was used in order to determine the crystal structure of the obtained material. The analysis results are shown in Table 2 and FIG. 5.

TABLE 2

| Atom | site | x | y | z | Occup. | Beq. |
|---|---|---|---|---|---|---|
| Bi | 2c | 0.25 | 0.25 | 0.37225(12) | 0.98 | 0.59(4) |
| Pb | 2c | 0.25 | 0.25 | 0.37225(12) | 0.02 | 0.59(4) |
| Cu | 2a | 0.75 | 0.25 | 0 | 1 | 1.29(10) |
| O | 2b | 0.75 | 0.25 | 0.5 | 1 | 0.9(4) |
| Te | 2c | 0.25 | 0.25 | 0.81955(17) | 1 | 0.55(5) |

Crystallographic data obtained from Rietveld refinement of $Bi_{0.98}Pb_{0.02}CuOTe$ [Space group P4/nmm (No. 129), a=4.04150(4) Å, c=9.53962(13) Å]

Figure 4:
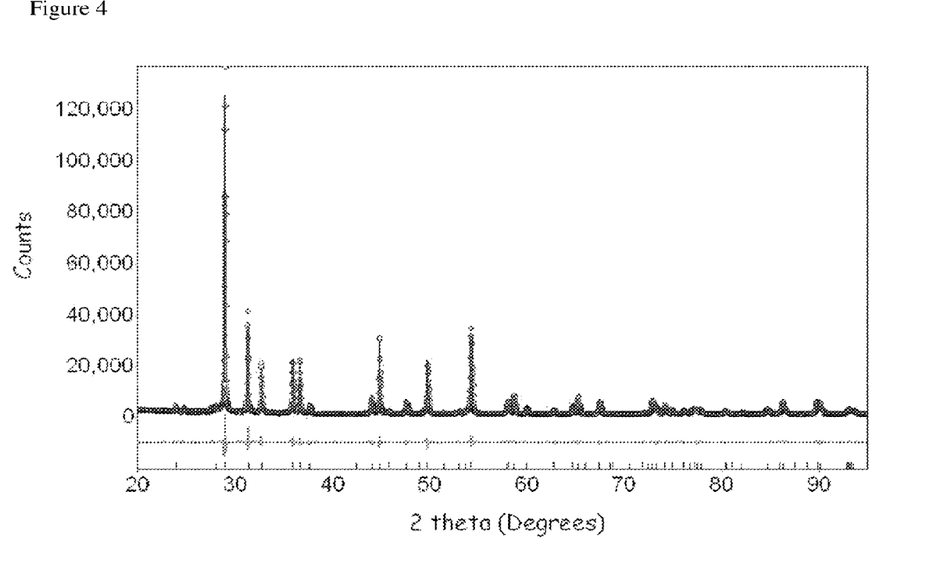
FIG. 4 shows Rietveld refinement profiles for $Bi_{0.98}Pb_{0.02}CuOTe$, comparing X-ray diffraction pattern with a calculated pattern from a structural model.

FIG. 4 shows a Rietveld refinement profile that compares observed X-ray diffraction pattern of $Bi_{0.98}Pb_{0.02}CuOTe$ with calculated pattern of a structural model. FIG. 4 shows that the measured pattern well agrees with the calculated pattern according to Table 2, which implies that the material obtained in this example is $Bi_{0.98}Pb_{0.02}CuOTe$.

Figure 5:
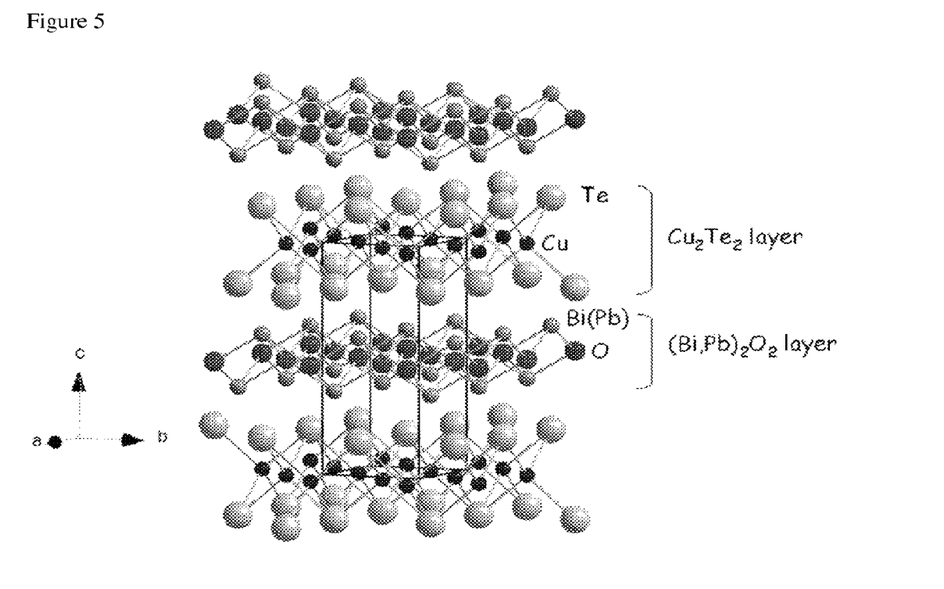
FIG. 5 shows the crystal structure of $Bi_{0.98}Pb_{0.02}CuOTe$.
Figure 6:
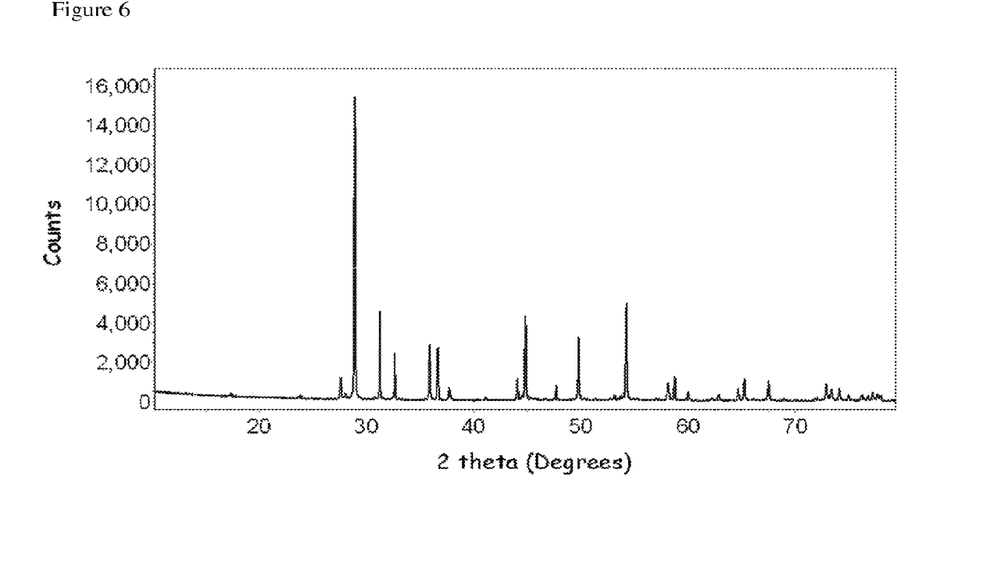
FIG. 6 shows X-ray diffraction pattern of $Bi_{0.9}Pb_{0.1}CuOTe$.

As shown in FIG. 5, the $Bi_{0.98}Pb_{0.02}CuOTe$ exhibits a natural super-lattice structure in which $Cu_2Te_2$ layers and $(Bi,Pb)_2O_2$ layers where Pb is partially substituted in place of Bi are repeated along a c-crystalline axis.

Example 4

$Bi_{0.9}Pb_{0.1}CuOTe$

In order to prepare $Bi_{0.9}Pb_{0.1}CuOTe$, 1.2721 g of $Bi_2O_3$ (Aldrich, 99.9%, 100 mesh), 0.6712 g of Bi (Aldrich, 99.99%, <10 m), 0.6133 g of Cu (Aldrich, 99.7%, 3 m), 0.215 g of PbO (Canto, 99.5%), and 1.2294 g of Te (Aldrich, 99.99%, ~100 mesh) were well mixed by using agate mortar, and then heated in an evacuated silica tube at 510° C. for 15 hours, thereby obtaining $Bi_{0.9}Pb_{0.1}CuOTe$ powder.

X-ray diffraction analysis was conducted for the sample in the same way as the example 3. As shown in FIG. 4, the material obtained in the example 4 was identified as $Bi_{0.9}Pb_{0.1}CuOTe$.

Example 5

$Bi_{0.9}Cd_{0.1}CuOTe$

In order to prepare $Bi_{0.9}Cd_{0.1}CuOTe$, 1.3018 g of $Bi_2O_3$ (Aldrich, 99.9%, 100 mesh), 0.6869 g of Bi (Aldrich, 99.99%, <10 m), 0.6266 g of Cu (Aldrich, 99.7%, 3 m), 0.1266 g of CdO (Strem, 99.999%), and 1.2582 g of Te (Aldrich, 99.99%, ~100 mesh) were well mixed by using agate mortar, and then heated in an evacuated silica tube at 510° C. for 15 hours, thereby obtaining $Bi_{0.9}Cd_{0.1}CuOTe$ powder.

Figure 7:
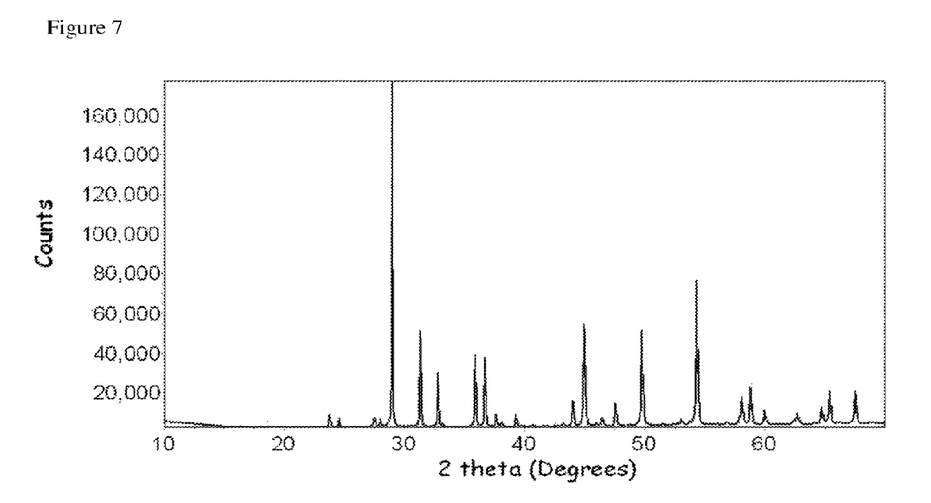
FIG. 7 shows X-ray diffraction pattern of $Bi_{0.9}Cd_{0.1}CuOTe$.

X-ray diffraction analysis was conducted for the sample in the same way as the example 3. As shown in FIG. 7, the material obtained in the example 5 was identified as $Bi_{0.9}Cd_{0.1}CuOTe$.

Example 6

$Bi_{0.9}Sr_{0.1}CuOTe$

In order to prepare $Bi_{0.9}Sr_{0.1}CuOTe$, 1.0731 g of $Bi_2O_3$ (Aldrich, 99.9%, 100 mesh), 0.5662 g of Bi (Aldrich, 99.99%, <10 m), 0.5165 g of Cu (Aldrich, 99.7%, 3 m), 1.0372 g of Te (Aldrich, 99.99%, ~100 mesh), and 0.0842 g of SrO were well mixed by using agate mortar. Here, SrO was obtained by thermally treating $SrCO_3$ (Alfa, 99.994%) at 1125° C. for 12 hours in the air. The material obtained by thermal treatment was confirmed as SrO by X-ray diffraction analysis.

The mixture was then heated in an evacuated silica tube at 510° C. for 15 hours, thereby obtaining $Bi_{0.9}Sr_{0.1}CuOTe$ powder.

Figure 8:
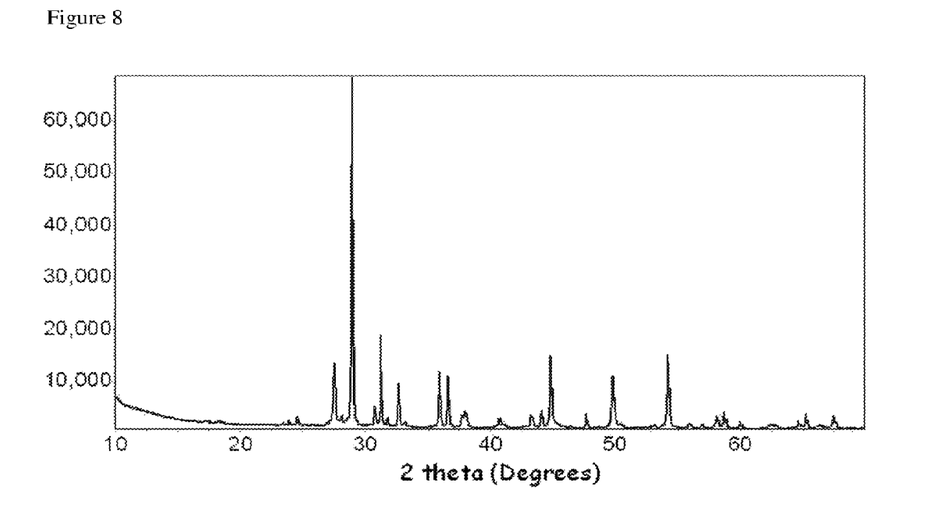
FIG. 8 shows X-ray diffraction pattern of $Bi_{0.9}Sr_{0.1}CuOTe$.

The powder X-ray diffraction (XRD) data were collected at room temperature on a Bragg-Brentano diffractometer (Bruker D8 Advance XRD) with a Cu X-ray tube (λ=1.5406 Å, 50 kV, 40 mA). The step size was 0.02 degree. FIG. 8 shows that the material obtained in the example 6 is $Bi_{0.9}Sr_{0.1}CuOTe$.

Example 7

$BiCuOSe_{0.5}Te_{0.5}$

In order to prepare $BiCuOSe_{0.5}Te_{0.5}$, 1.9822 g of $Bi_2O_3$ (Aldrich, 99.9%, 100 mesh), 0.889 g of Bi (Aldrich, 99.99%, <10 m), 0.811 g of Cu (Aldrich, 99.7%, 3 m), 0.5036 g of Se (Aldrich, 99.99%), and 0.8142 g of Te (Aldrich, 99.99%, ~100 mesh) were well mixed by using agate mortar, and then heated in an evacuated silica tube at 510° C. for 15 hours, thereby obtaining $BiCuOSe_{0.5}Te_{0.5}$ powder.

Figure 9:
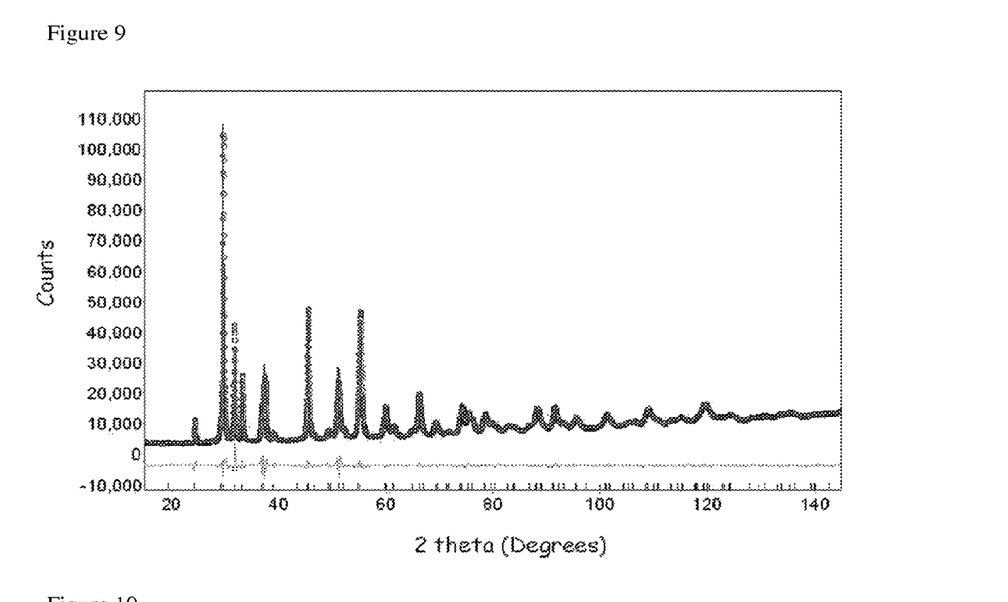
FIG. 9 shows Rietveld refinement profiles for $BiCuOSe_{0.5}Te_{0.5}$, comparing X-ray diffraction pattern with a calculated pattern from a structural model.

The powder X-ray diffraction (XRD) data were collected at room temperature on a Bragg-Brentano diffractometer (Bruker D4-Endeavor XRD) with a Cu X-ray tube (40 kV, 40 mA). The step size was 0.02 degree. At this time, variable 6 mm slit was used as a divergence slit. The results are shown in FIG. 9. Crystal structure analysis was executed in the same way as the example 3. The analysis results are shown in Table 3 and FIG. 10.

TABLE 3

| Atom | site | x | y | z | Occup. | Beq. |
|---|---|---|---|---|---|---|
| Bi | 2c | 0.25 | 0.25 | 0.36504(9) | 1 | 0.86(2) |
| Cu | 2a | 0.75 | 0.25 | 0 | 1 | 2.00(9) |
| O | 2b | 0.75 | 0.25 | 0.5 | 1 | 1.9(3) |

TABLE 3-continued

| Atom | site | x | y | z | Occup. | Beq. |
|------|------|------|------|------------|--------|---------|
| Te | 2c | 0.25 | 0.25 | 0.82272(14) | 0.5 | 0.61(4) |
| Se | 2c | 0.25 | 0.25 | 0.82252(14) | 0.5 | 0.55(5) |

Crystallographic data obtained from Rietveld refinement of BiCuOSe$_{0.5}$Te$_{0.5}$ [Space group P4/nmm (No. 129), a=3.99045(11) Å, c=9.2357(4) Å]

FIG. 9 shows that the measured pattern well agrees with the calculated pattern from the results in Table 3, and as a result the material obtained in this example is identified as BiCuOSe$_{0.5}$Te$_{0.5}$.

Figure 10:
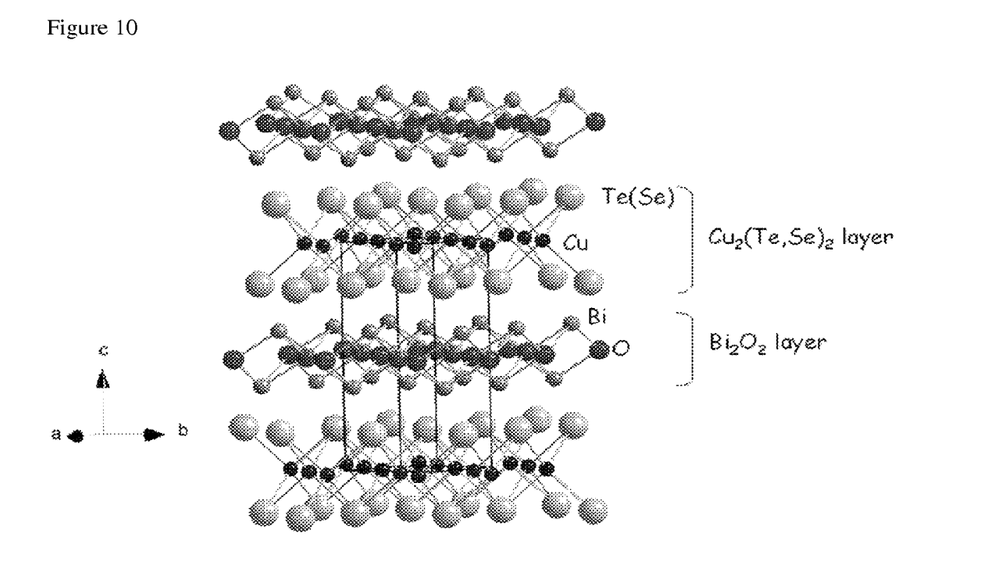
FIG. 10 shows the crystal structure of $BiCuOSe_{0.5}Te_{0.5}$.

As shown in FIG. 10, the BiCuOSe$_{0.5}$Te$_{0.5}$ compound semiconductors exhibits a natural super-lattice structure in which Cu$_2$(Te,Se)$_2$ layers and Bi$_2$O$_2$ layers are repeated along a c-crystalline axis.

Example 8

Bi$_{0.9}$Tl$_{0.1}$CuOTe

In order to prepare Bi$_{0.9}$Tl$_{0.1}$CuOTe, 1.227 g of Bi$_2$O$_3$ (Aldrich, 99.9%, 100 mesh), 0.7114 g of Bi (Aldrich, 99.99%, <10 m), 0.6122 g of Cu (Aldrich, 99.7%, 3 m), 1.2293 g of Te (Aldrich, 99.99%, ~100 mesh), and 0.22 g of Tl$_2$O$_3$ (Aldrich) were well mixed by using agate mortar.

The mixture was then heated in an evacuated silica tube at 510° C. for 15 hours, thereby obtaining Bi$_{0.9}$Tl$_{0.1}$CuOTe powder.

Figure 11:
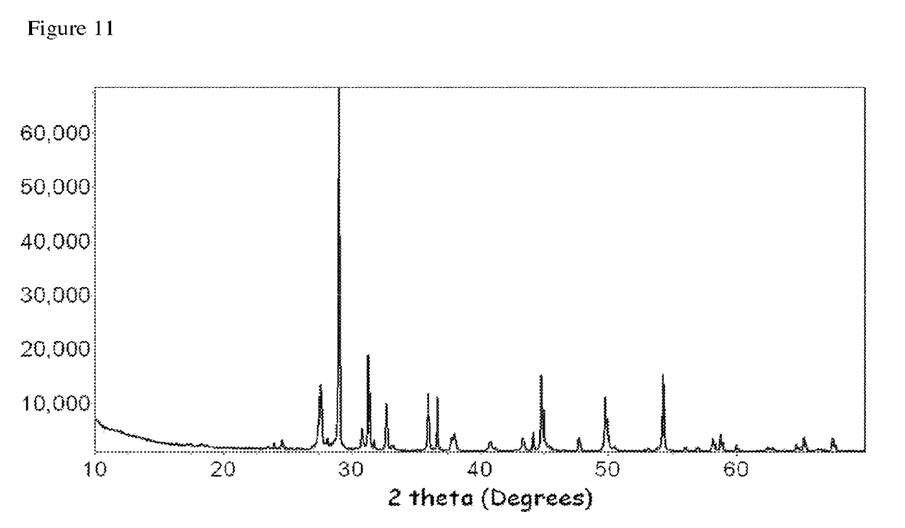
FIG. 11 shows X-ray diffraction pattern of $Bi_{0.9}Tl_{0.1}CuOTe$.

X-ray diffraction analysis was conducted for the sample in the same way as the example 3. As shown in FIG. 11, the material obtained in the example 8 was identified as Bi$_{0.9}$Tl$_{0.1}$CuOTe.

Example 9

BiCuOTe$_{0.9}$Sb$_{0.1}$

In order to prepare BiCuOTe$_{0.9}$Sb$_{0.1}$, 1.4951 g of Bi$_2$O$_3$ (Aldrich, 99.9%, 100 mesh), 0.6705 g of Bi (Aldrich, 99.99%, <10 m), 0.6117 g of Cu (Aldrich, 99.7%, 3 m), 1.1054 g of Te (Aldrich, 99.99%, ~100 mesh), and 0.1172 g of Sb (Kanto chemical, Cat. No. 01420-02) were well mixed by using agate mortar.

The mixture was then heated in an evacuated silica tube at 510° C. for 15 hours, thereby obtaining BiCuOTe$_{0.9}$Sb$_{0.1}$ powder.

Figure 12:
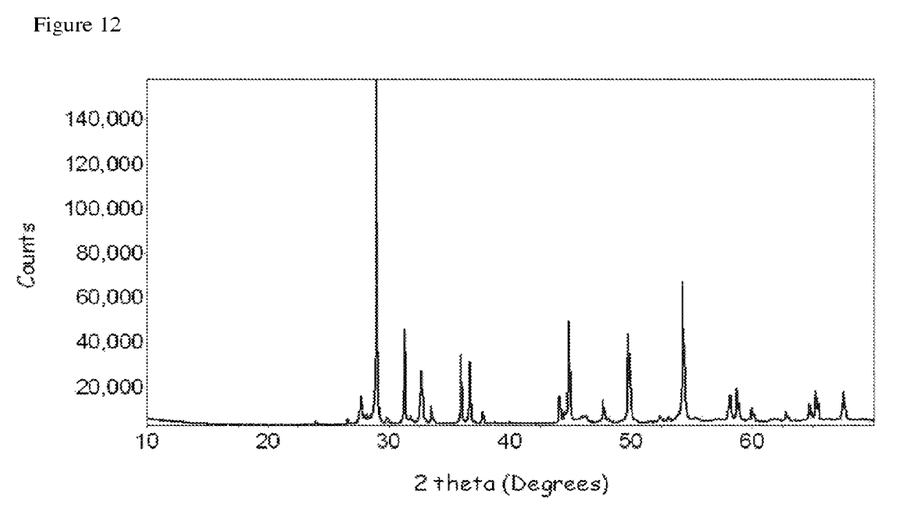
FIG. 12 shows X-ray diffraction pattern of $BiCuOTe_{0.9}Sb_{0.1}$.

X-ray diffraction analysis was conducted for the sample in the same way as the example 3. As shown in FIG. 12, the material obtained in the example 9 was identified as BiCuOTe$_{0.9}$Sb$_{0.1}$.

Measurement of Optical Bandgap Energy

Figure 13:
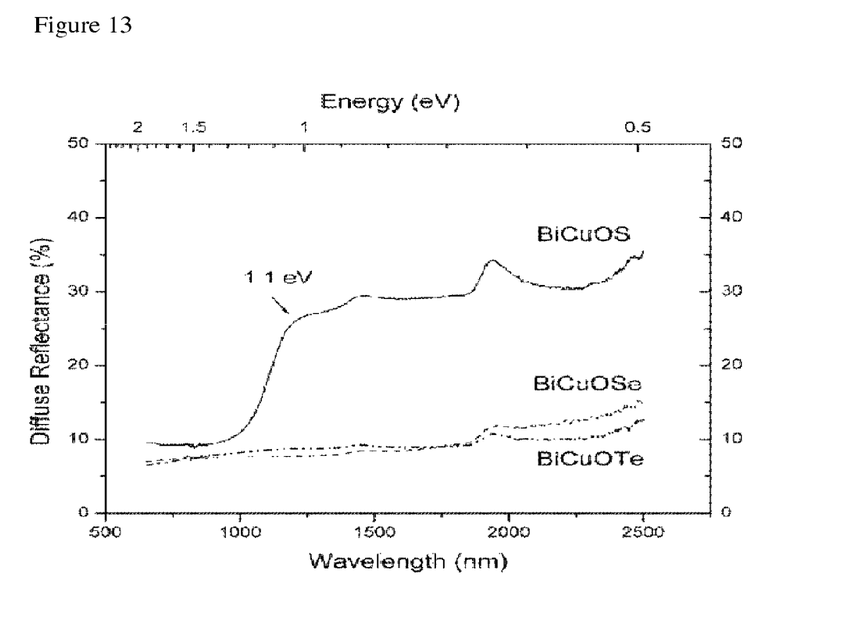
FIG. 13 shows diffuse reflectance spectra of BiCuOTe, BiCuOSe, and BiCuOS, illustrating the process of obtaining bandgap energy of the compounds.
Figure 14:
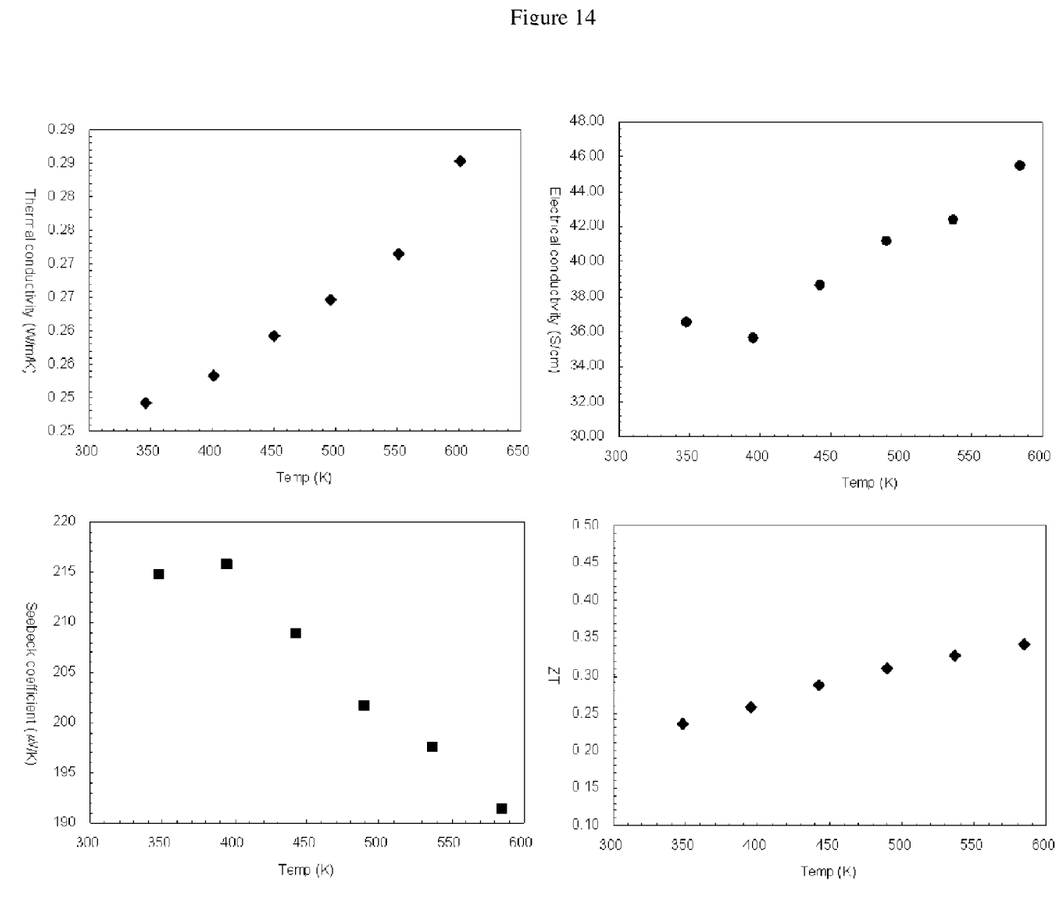
FIG. 14 shows electrical conductivities, Seebeck coefficients, thermal conductivities, and ZT values of BiCuOTe at different temperatures.
Figure 15:
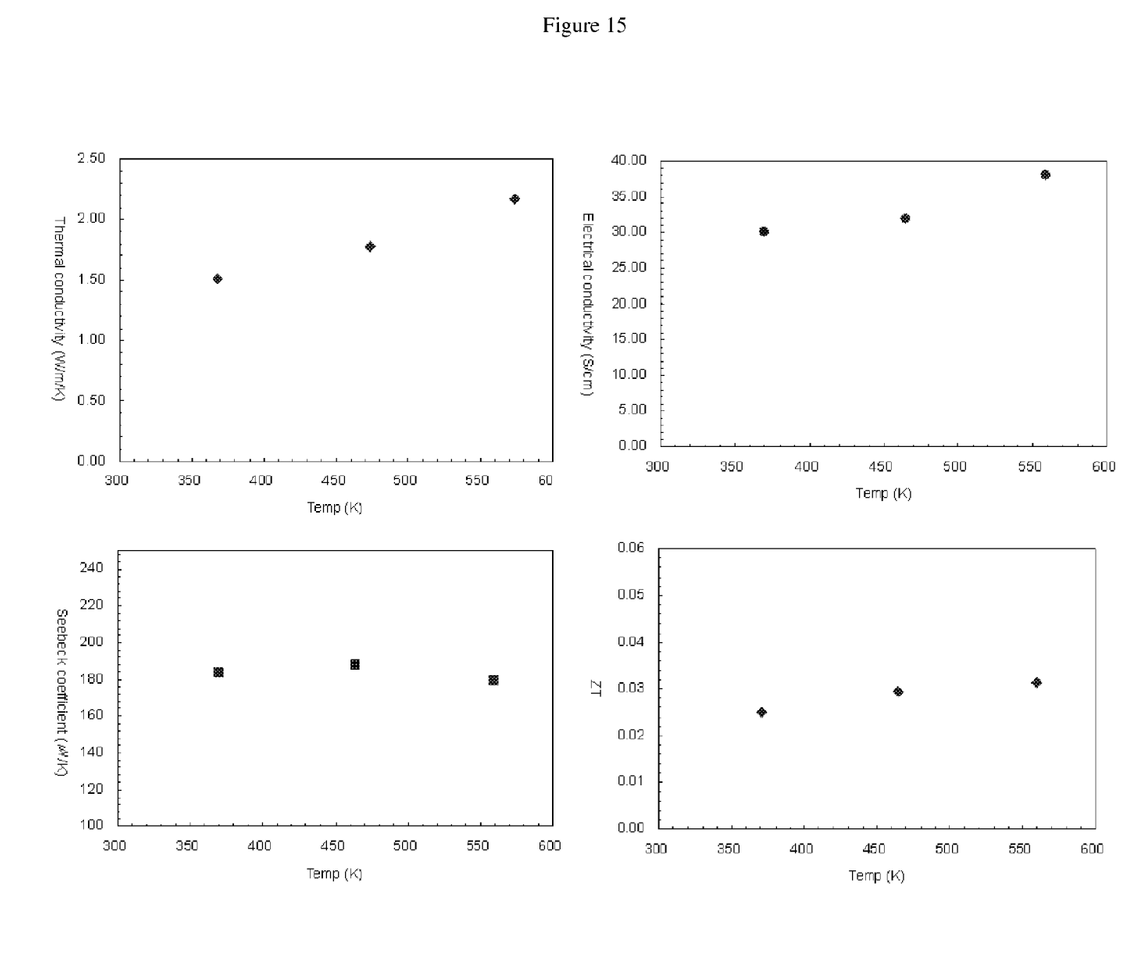
FIG. 15 shows electrical conductivities, Seebeck coefficients, thermal conductivities, and ZT values of $Bi_{0.9}Sr_{0.1}CuOTe$ at different temperatures.
Figure 16:
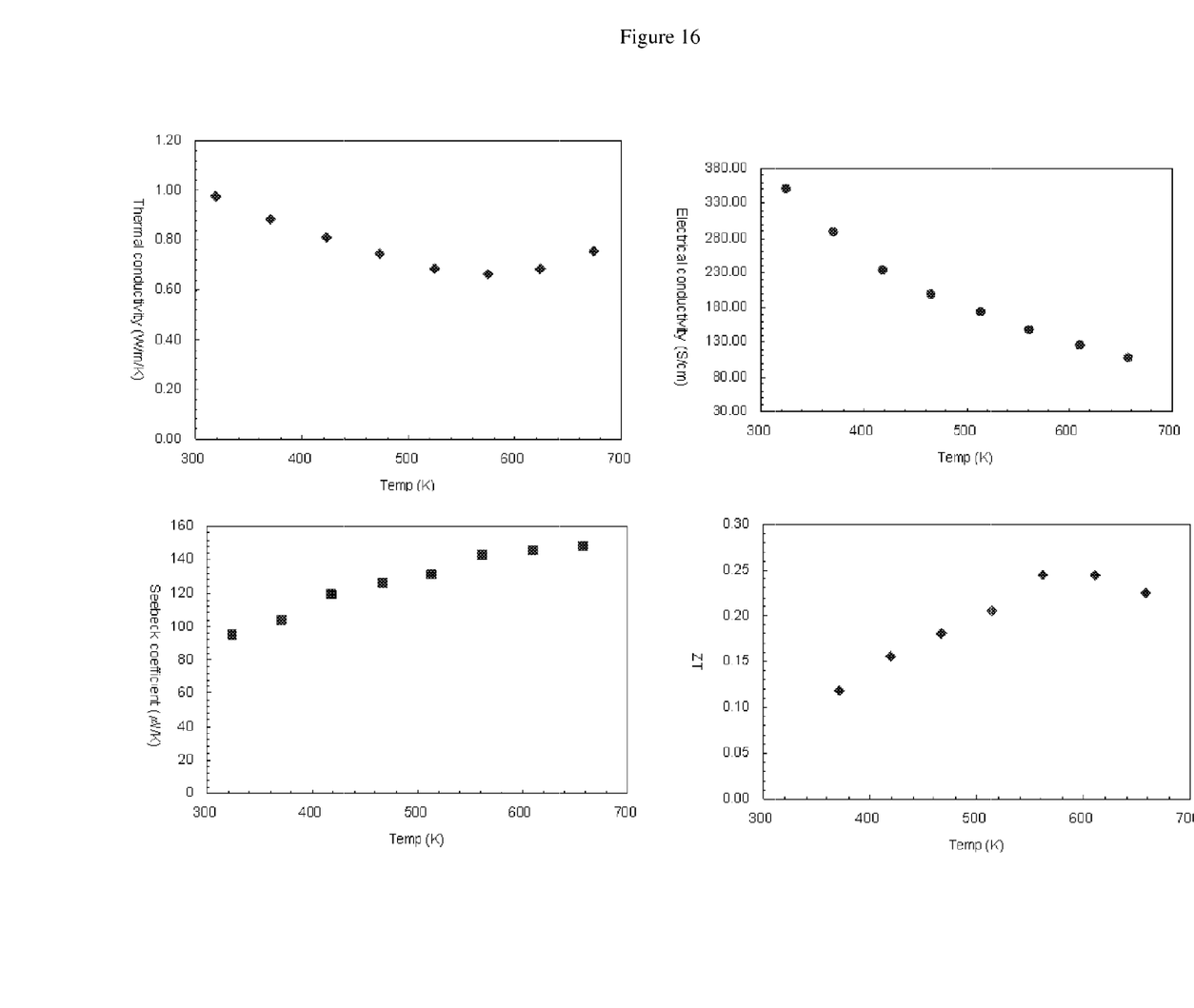
FIG. 16 shows electrical conductivities, Seebeck coefficients, thermal conductivities, and ZT values of $Bi_{0.9}Cd_{0.1}CuOTe$ at different temperatures.
Figure 17:
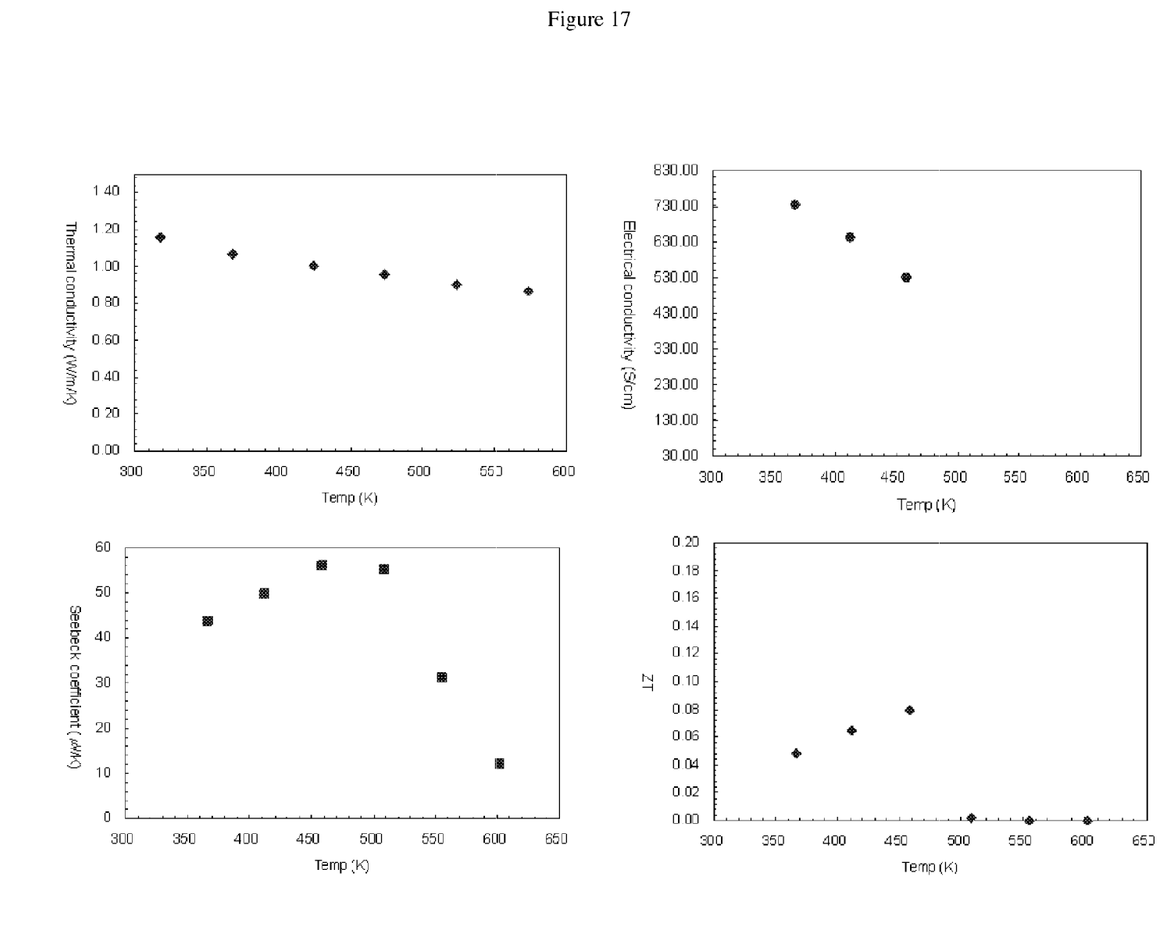
FIG. 17 shows electrical conductivities, Seebeck coefficients, thermal conductivities, and ZT values of $Bi_{0.9}Pb_{0.1}CuOTe$ at different temperatures.
Figure 18:
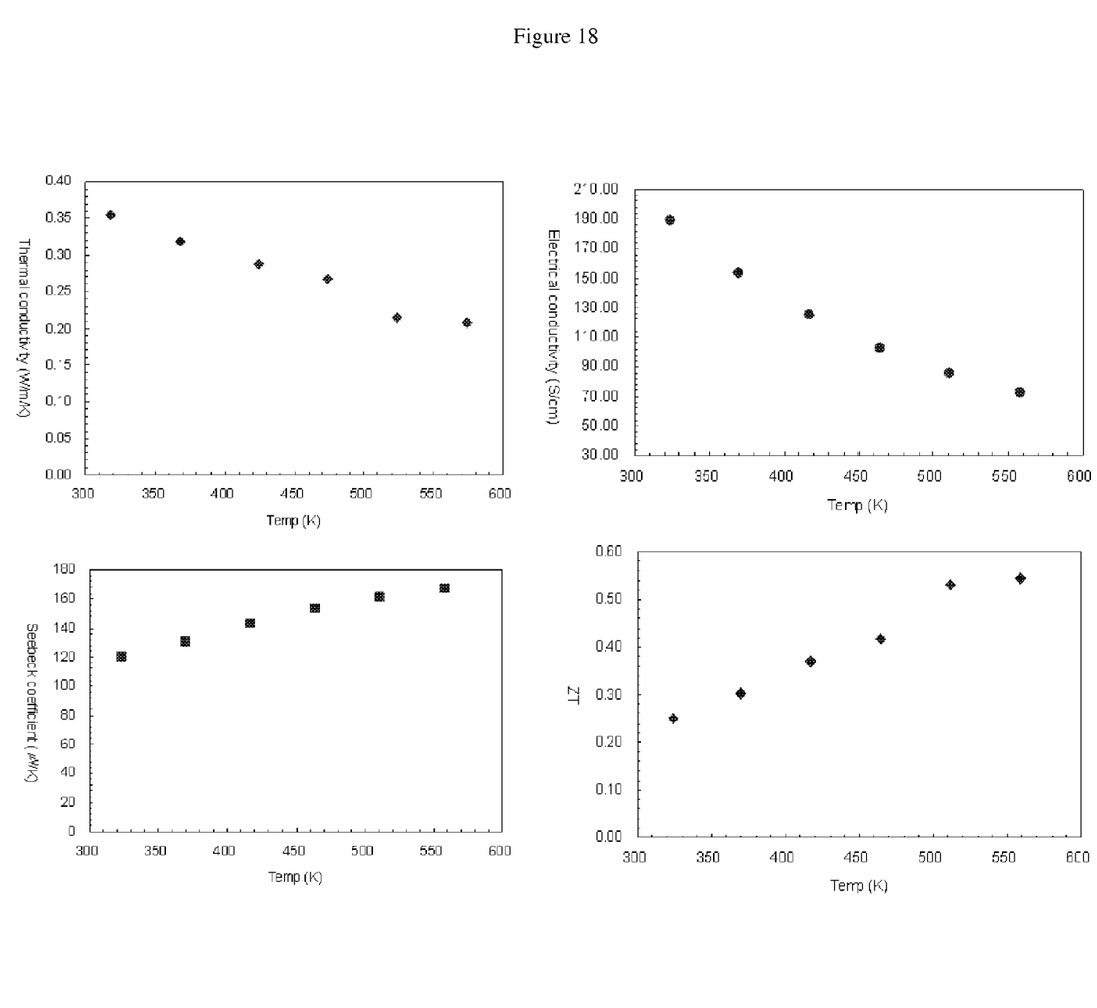
FIG. 18 shows electrical conductivities, Seebeck coefficients, thermal conductivities, and ZT values of $Bi_{0.98}Pb_{0.02}CuOTe$ at different temperatures.
Figure 19:
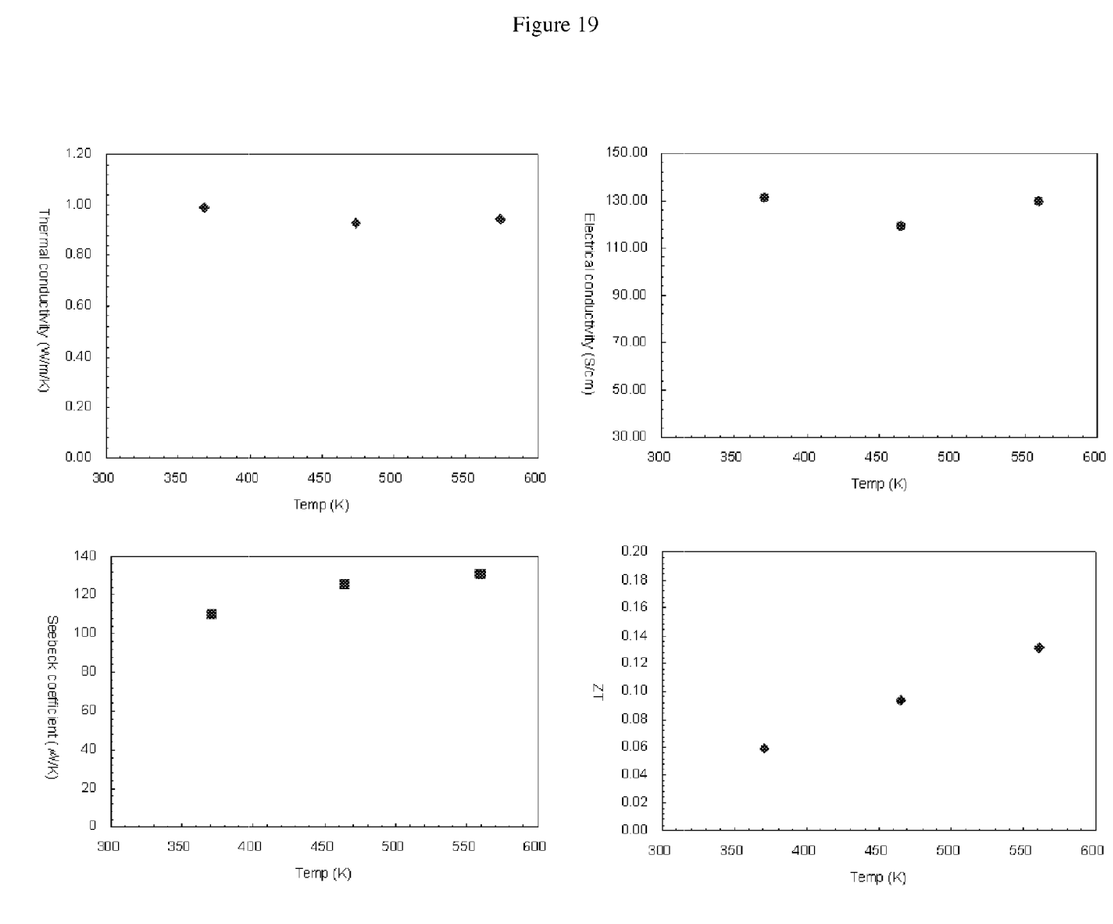
FIG. 19 shows electrical conductivities, Seebeck coefficients, thermal conductivities, and ZT values of $Bi_{0.9}Tl_{0.1}CuOTe$ at different temperatures.

Diffuse reflectance spectrum for the sample prepared in the example 1 was obtained by using a Shimadzu UV-3600. The measurement range was 650 to 2500 nm with step size of 1 nm. FIG. 13 shows reflectance spectra of BiCuOS and BiCuOSe for the purpose of comparison. Bandgap energy of about 1.1 eV was observed for BiCuOS, while no absorption edge was observed down to 2500 nm (=0.496 eV) for BiCuOTe, which implies that BiCuOTe of the example 1 has bandgap energy smaller than 0.5 eV.

Evaluation of Thermoelectric Conversion Performance

Powder samples were shaped into cylinders with a diameter of 4 mm and a length of 15 mm (for electrical conductivity and Seebeck coefficient measurements), and disks having a diameter of 10 mm and a thickness of 1 mm (for thermal conductivity measurements) by using CIP at the pressure of 200 MPa. Subsequently, the resultant disks and cylinders were heated in an evacuated silica tube at 510° C. for 10 hours.

For the sintered cylinders, electric conductivity and Seebeck coefficient were measured by using a ZEM-2 (Ulvac-Rico, Inc.). The measurement results are shown in FIGS. 14 to 19. For example, at 346 K thermal conductivities of BiCuOTe and Bi$_{0.98}$Pb$_{0.02}$CuOTe were measured as 0.25 W/m/K and 0.35 W/m/K, respectively, which are significantly lower than those of Bi$_2$Te$_3$ (1.9 W/m/K, T. M. Tritt, M. A. Subramanian, MRS Bulletin 31 (2006) 188-194) and Co$_4$Sb$_{12}$:In$_{0.2}$ (2 W/m/K, T. He, J. Chen, D. Rosenfeld, M. A. Subramanian, Chem. Mater. 18 (2006) 759-762) which are representative thermoelectric conversion materials.

Meanwhile, for the sintered disks, thermal conductivity was measured by using TC-9000 (Ulvac-Rico, Inc). The measurement results are shown in FIGS. 14 to 19.

ZT value of each sample was calculated using the measured values. The calculated results are shown in FIGS. 14 to 19.

The invention claimed is:

1. The thermoelectric conversion materials having a natural super-lattice structure in which BiTeCu layers alternate with O layers along a c-crystalline axis,
wherein the thermoelectric conversion materials are expressed by following formula 1:

$$Bi_{1-x}M_xCU_{1-w}O_{a-y}Q1_yTe_{b-z}Q2_z,$$

wherein at least one of Bi, O and Te is partially substituted by M, Q1 and Q2, respectively, and
wherein M is at least one element selected from the group consisting of Ba, Sr, Ca, Mg, Cs, K, Na, Cd, Hg, Sn, Pb, Mn, Ga, in, Tl, as and Sb; Q1 and Q2 are at least one element selected from the group consisting of S, Se, As and Sb; x, y, z, w, a and b are 0≤x<1, 0≤w<1, 0.2<a<4, 0≤y<4, 0.2<b<4, 0≤z<4, b>z and x+y+z>0.

2. The thermoelectric conversion materials according to claim 1,
wherein the x, y and z satisfy the following relations: 0≤x≤½, 0≤y<½ and 0≤z≤0½.

3. The thermoelectric conversion materials according to claim 1, wherein the x, y, z and w satisfy the following relations:
0.1≤x<0.15, 0≤y<0.2, 0≤z<0.5 and 0≤w≤0.2.

4. The thermoelectric conversion materials according to claim 1,
wherein the M is any one selected from the group consisting of Sr, Cd, Pb and Tl.

5. The thermoelectric conversion materials according to claim 1,
wherein the Q1 and Q2 are respectively Se or Sb.

6. The thermoelectric conversion materials according to claim 1, wherein the x, y, z and w satisfy the following relations:
0≤x<0.15, 0≤y<0.2, 0≤z<0.5 and 0≤w≤0.2;
the M is any one selected from the group consisting of Sr, Cd, Pb and Tl; and
the Q1 and Q2 are respectively Se or Sb.

7. The thermoelectric conversion materials according to claim 6,
wherein the x, y, z and w satisfy the following relations: 0<x<0.15, y=0, z=0 and w=0; and
the M is any one selected from the group consisting of Sr, Cd, Pb and Tl.

8. The thermoelectric conversion materials according to claim 6,
wherein the x, y, z and w satisfy the following relations: x=0, y=0, 0<z≤0.5 and w=0; and
the Q2 is Se or Sb.

9. A thermoelectric conversion element, which includes the thermoelectric conversion materials defined in claim 1.

* * * * *